United States Patent [19]
Lu

[11] Patent Number: 5,213,992
[45] Date of Patent: May 25, 1993

[54] RIPPLED POLYSILICON SURFACE CAPACITOR ELECTRODE PLATE FOR HIGH DENSITY DRAM

[75] Inventor: Chih-Yuan Lu, Taipei, Taiwan

[73] Assignee: Industrial Technology Research Institute, Hsinchu, Taiwan

[21] Appl. No.: 769,723

[22] Filed: Oct. 2, 1991

[51] Int. Cl.$^5$ .............................................. H01L 21/72
[52] U.S. Cl. ....................... 437/52; 437/228; 437/233; 437/977; 148/DIG. 104; 430/314; 430/319; 430/396
[58] Field of Search ............... 148/DIG. 14, DIG. 43, 148/DIG. 51, DIG. 104, DIG. 109, DIG. 138, DIG. 122; 430/314, 317, 319, 396; 437/228, 233, 235, 967, 978, 919, 977, 241, 52, 59, 60

[56] References Cited

U.S. PATENT DOCUMENTS 5,112,773 5/1992 Tuttle .................................. 437/977
5,149,676 9/1992 Kim et al. ........................... 437/977

Primary Examiner—George Fourson
Attorney, Agent, or Firm—George O. Saile

[57] ABSTRACT

A new method to produce a microminiturized capacitor having a regular microscopic ripple surface electrode is achieved by depositing a first polysilicon layer over a suitable insulating base. A resist layer is formed over the first polysilicon layer. The resist layer is exposed through a mask having a pattern of regular spaced openings in the areas of the planned capacitor to radiant energy in sufficient quantity to under expose, out of focus expose or a combination of under expose and out of focus expose the resist layer. The mask is shifted a fixed and short distance. The resist layer is exposed through the shifted mask to radiant energy in sufficient quantity to under expose or out of focus expose, or a combination of under expose or out of focus expose the resist layer again and in a different location. The shifting of the mask and exposing resist steps are repeated until a pattern of the regular microscopic ripple has been formed in the resist layer. The resist layer is developed to leave the pattern of regular microscopic ripple in the surface of the resist layer. The resist layer and said first polysilicon layer is uniformly and anisotropically etched to create the pattern of regular microscopic ripple in the surface of the first polysilicon layer. The remaining resist layer is removed. An insulating layer is deposited over the ripple surface. The capacitor structure is completed by depositing a second polysilicon layer over the insulating layer.

25 Claims, 3 Drawing Sheets

RIPPLED POLYSILICON SURFACE CAPACITOR ELECTRODE PLATE FOR HIGH DENSITY DRAM

BACKGROUND OF THE INVENTION

1. Field of the Invention

This invention relates to the fabrication of integrated circuit devices and more particularly to a method of fabricating high density dynamic random access memory (DRAM) devices which feature a new capacitor structure.

2. Description of the Prior Art

As DRAMs are scaled down in dimensions, there is a continuous challenge to maintain a sufficiently high stored charge per capacitor unit area. In order to construct high density DRAMs in a reasonable sized chip area, the cell structures have to change from the conventional planar-type capacitors to either trench capacitors or stack capacitors, in particular beyond the 4 Mbit DRAM era. All efforts to increase capacitance without increasing the planar area of the capacitor can be categorized into the following techniques:

(1) Thinning the capacitor dielectric and/or using films with a higher dielectric constant, such as oxide-nitride-oxide (ONO) films composite, and more recently tantalum pentoxide which will require further development to overcome leakage and reliability problems.

(2) Building three dimensional capacitor structures to increase the capacitor area without increasing the planar area of the capacitor. There are two major branches of this approach, that is trench capacitors and stacked capacitors. In the category of trench capacitors, when the DRAM is beyond 16 Mbit, the trench needs to be very deep. There are technology and even theoretical physical limitations to processing the deep trenches that would be needed. When the stacked capacitor approach is used to fabricate 16 Mbit DRAMs and beyond, very complicated stacked structures are needed, such as fin structures, crown structures, and so forth. The making of such structures require complicated manufacturing processes which are costly and result in reduced yield.

Most recently a new concept has been advanced which calls for roughening the polycrystalline silicon surface of the capacitor electrode to increase the surface area. Several techniques for achieving a roughened surface of a polycrystalline silicon electrode layer have been suggested in technical paper recently presented by M. Sakao et al entitled "A CAPACITOR-OVER-BIT-LINE (COB) CELL WITH A HEMISPHERICAL-GRAIN STORAGE NODE FOR 64 Mb DRAMs" in IEDM 1990 TECHNICAL DIGEST pages 655-658; M. Yoshimaru et al entitled "RUGGED SURFACE POLY-SI ELECTRODE AND LOW TEMPERATURE DEPOSITED SILICON NITRIDE FOR 64 MBIT AND BEYOND STC DRAM CELL" in IEDM 1990 TECHNICAL DIGEST pages 659-662; Pierre C. Fazan et al entitled "ELECTRICAL CHARACTERIZATION OF TEXTURED INTERPOLY CAPACITORS FOR ADVANCED STACKED DRAMs" in IEDM 1990 TECHNICAL DIGEST pages 663-666; and R. Lee et al U.S. Pat. No. 5,037,773.

These techniques cited in the above paragraph have small process window and are difficult to control in a manufacturing environment.

A U.S. Pat. No. 5,110,752 filed 07/10/91 by the author of the present Patent Application, C. Y. Lu and entitled "Roughened Polysilicon Surface Capacitor Electrode Plate for High Density DRAM" describes a new method and resulting device for making a capacitor structure which has increased capacitance through roughening by a metal silicide preferential growth at the grain boundaries of the first polysilicon layer and then the removal of the metal silicide.

SUMMARY OF THE INVENTION

A principal object of the invention is to provide an effective and very controllable manufacturable method to fabricate a capacitor device having an increased effective electrode surface area and the resulting capacitor structure wherein the surface area is increased by a regular microscopic ripple surface structure.

Another object of this invention is to provide an new method for producing a regular ripple microscopic surface on a polycrystalline silicon surface for use in highly dense capacitor structures.

Yet another object of this invention is to provide a new more reliable method for producing high density DRAM devices and the resulting structure which features a new stacked capacitor having a regular microscopic surface structure.

In accordance with these objects of this invention, a new method to produce a microminiturized capacitor having a regular microscopic ripple surface electrode is achieved. The method involves depositing a first polycrystalline silicon layer over a suitable insulating base. A resist layer is formed over the first polycrystalline silicon layer. The resist layer is exposed through a mask having a pattern of regular spaced openings in the areas of the planned capacitor to radiant energy in sufficient quantity to under-expose, out of focus expose or a combination of under-expose and out of focus expose the resist layer. The mask is shifted a fixed and short distance. The resist layer is exposed through the shifted mask to radiant energy in sufficient quantity to under-expose or out of focus expose, or a combination of under-expose or out of focus expose the resist layer again and in a different location. The shifting of the mask and exposing resist steps are repeated until a pattern of the regular microscopic ripple has been formed in the resist layer. The resist layer is developed to leave the pattern of regular microscopic ripple in the surface of the resist layer. The resist layer and said first polycrystalline silicon layer is uniformly and anisotropically etched to create the pattern of regular microscopic ripple in the surface of the first polycrystalline layer. The remaining resist layer is removed. An insulating layer is deposited over the ripple surface. The capacitor structure is completed by depositing a second polycrystalline silicon layer over the insulating layer.

A modification of the above method is to use a thin layer, such as silicon oxide between the resist layer and the polysilicon layer. The resist layer may be thinner than in the first embodiment and the exposures can almost be through the resist layer. Development of the resist produces the ripple in the resist as in the first embodiment. The resist layer and the thin layer, such as silicon oxide are uniformly and anisotropically etched to create the pattern of regular microscopic ripple in the surface of the silicon oxide layer. Now the thin layer, such as silicon oxide is used as a mask to anisotropically etch the first polycrystalline silicon layer to create the pattern of ripple in the surface of the polycrystalline silicon layer.

A stacked capacitor having a first polycrystalline silicon electrode layer with a regular microscopic ripple surface can be made. The ripple surface has substantially uniform ripple size of less than about 0.1 micrometers and a spacing of less than about 0.1 micrometers in the first polycrystalline silicon layer. A thin dielectric layer covers the ripple surface. A second electrode layer covers the dielectric layer. Means are provided for electrically connecting the first and second electrodes to form the capacitor.

BRIEF DESCRIPTION OF THE DRAWINGS

In the accompanying drawings forming a mateiral par of this description, there is shown.

DESCRIPTION OF THE PREFERRED EMBODIMENTS

Figure 1:
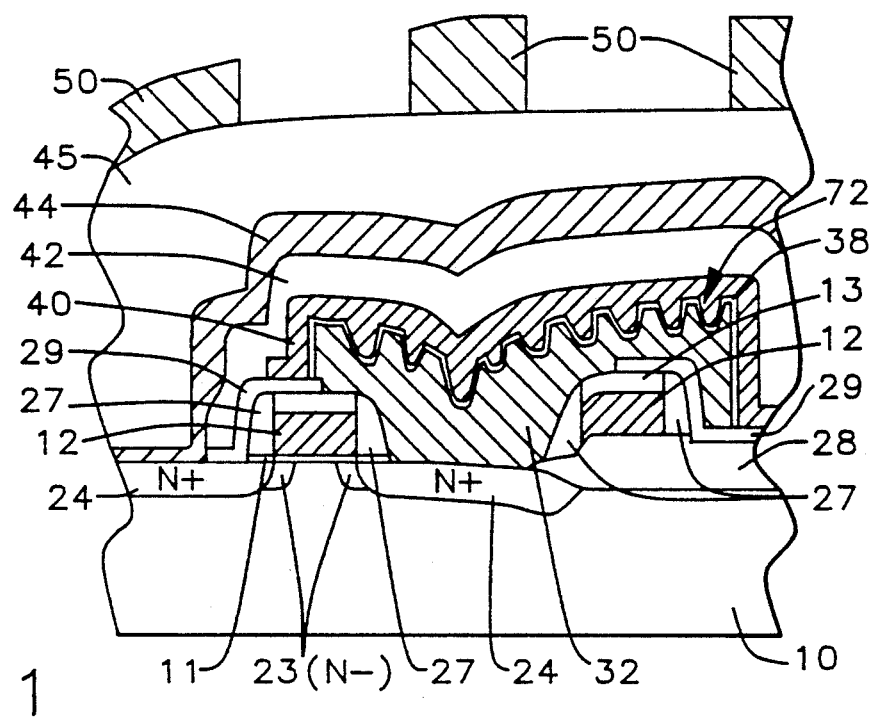
FIG. 1 is a schematic cross-sectional representation of one preferred embodiment of this invention.

Referring now to FIG. 1, there is illustrated a DRAM structure having the new capacitor structure of the invention fabricated therein. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field Oxide pattern, FOX 28. Then semiconductor devices can be provided in the silicon mesas according to the following processes.

The surface of the silicon substrate 10 is thermally oxidized to form the desired gate oxide 11 thickness. The preferred thickness is between about 80 to 200 Angstroms. The polysilicon layer 12 is blanket deposited by LPCVD (Low Pressure Chemical Vapor Deposition) method. The preferred thickness of the polysilicon layer 12 is between about 2000 to 4000 Angstroms. The polysilicon layer 12 is ion implanted with phosphorous or arsenic ions under the conditions 5 to 10 E 15 dosage atoms per cm$^2$ and 20 to 60 Kev. or doped with phosphorus oxychloride at a temperature about 900° C. The surface of the layer is either thermally oxidized or a chemical vapor deposition process to form silicon oxide layer 13. The layers 11, 12 and 13 are patterned by conventional lithography and anisotropic etching techniques as are conventional in the art to provide a desired pattern of gate electrodes and structure on the FOX 28 surfaces or elsewhere as seen in FIG. 1.

The source/drain structure of the MOS FET may now be formed by the following steps. The FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the ion implantations of N-dopants. Lithographic masks may be required to protect the areas not to be subjected to that particular N-ion implantation. The formation of the lithographic masks are done by conventional lithography and etching techniques. The N-lightly doped drain implantation 23 are done with, for example phosphorous P31 at a dose of between about 1 to 10 E 13 atoms/cm.$^2$ and with an energy of between about 20 to 40 Kev.

The dielectric spacer 27 is now to be formed followed by the completion of the lightly doped drain source/drain structures. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 27 is between about 2000 to 5000 Angstroms and preferably about 2500 Angstroms.

An anisotropic etching of this layer produces the dielectric spacer layer 27 on the sidewalls of the layer structures 11, 12, 13. The preferred anisotropic etching uses a conventional reactive ion etching ambient.

The N+ source/drain ion implantation uses Arsenic, As75 with a dose of between about 2 E 15 to 1 E 16 atoms/cm.$^2$ and energy of between about 20 to 70 Kev. to complete the source/drain regions 22 of the N channel lightly doped drain MOS FET integrated circuits device as seen in the FIG. 2.

A thin silicon oxide, silicon nitride or the like masking layer 29 is formed upon the layer structure regions 11, 12, 13; the spacers 27 and the exposed monocrystalline silicon substrate regions. The conditions for forming this layer 29 are LPCVD deposition of TEOS or LPCVD silicon nitride deposition at about 600° to 900° C. or a composite layer of silicon oxide and nitride. The preferred thickness of this dielectric layer is between about 200 to 1000 Angstroms and a preferred thickness of about 600 Angstroms. The layer 29 is removed by conventional lithography and etching from the surface of the DRAM active drain areas as shown in FIG. 1 to form the capacitor node contact area.

The capacitor structure is fabricated by depositing a first polycrystalline silicon layer 32 over the surface of the substrate 30 using the same deposition techniques described in regard to polycrystalline silicon layer 12. The thickness of the first layer is typically between about 3000 to 6000 Angstroms. An impurity is introduced into the first layer, either by ion implantation techniques or in situ doping. The impurity concentration in this first layer 32 is preferably between about $10^{18}$ to $10^{21}$ atoms per cm.$^3$.

Figure 2A:
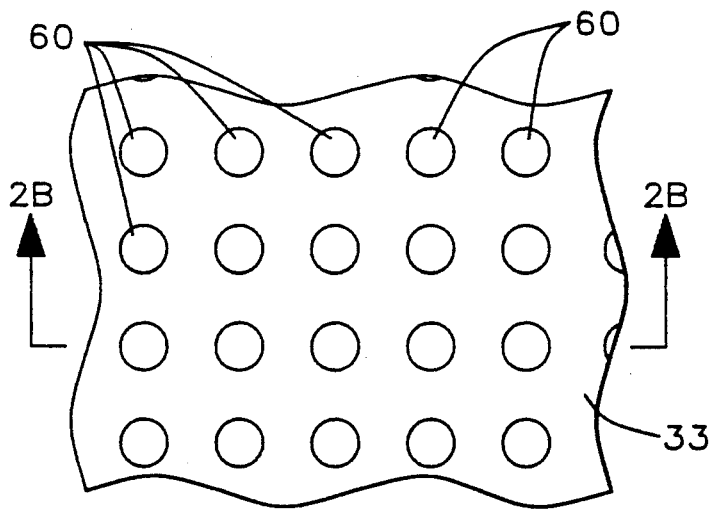
FIGS. 2A and 2B schematically show how the a resist pattern can be exposed through a mask.
Figure 2B:
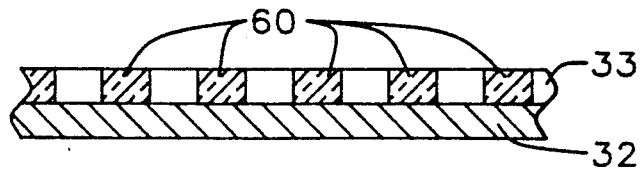

Referring now to FIGS. 2A and 2B, before patterning the first polycrystalline silicon electrode 32, a resist layer 33 is spin coated over the electrode layer 32. Then a mask having a pattern of regular spaced openings in the areas of the planned capacitor is positioned over the electrode layer 32. This mask, when used for example in projection type lithography has regular holes of less than about 2.5 micrometers and hole spacing of less than about 2.5 micrometers in both the X and Y directions in the planned capacitor regions. For example, the holes can be 2.5 micrometers in diameter and 2.5 micrometers spacing. With a 5× reduction projector type lithographic stepper, the resolution on the resist layer 33, when the resist layer 33 is fully exposed through this mask, that the best resolution of hole opening of 0.5 by 0.5 micrometers spacing (pitch=1.0 micrometers) can be produced on the photoresist after development. But on the glass mask, the hole and spacing is 0.5×5 micrometers and 0.5 micrometers×5, respectively. FIG. 2A shows the top view and the FIG. 2B shows the cross-sectional view taken along line 2B;2B of FIG. 2A of the resist layer 33 with full exposure to a radiant energy, such as visible light, E beam, X-ray, etc. The areas exposed through the mask are indicated as 60.

Figure 3:
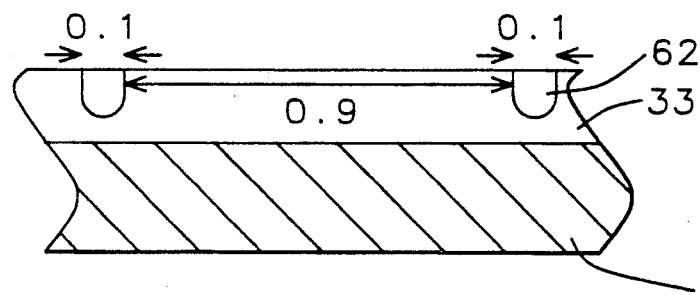
FIGS. 3, 4 and 5 schematically show a first embodiment method for making the regular microscopic ripple capacitor of the present invention.
Figure 4:
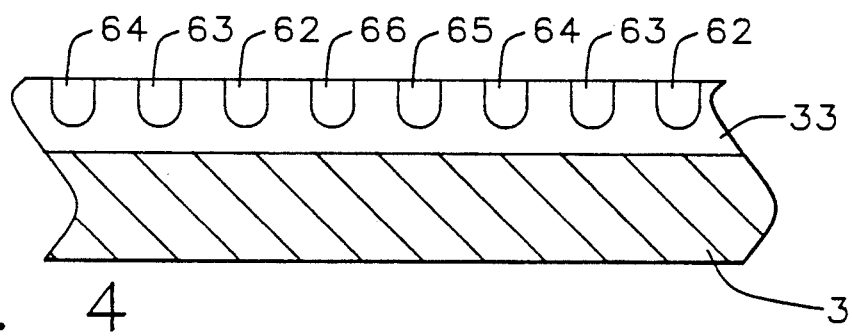
Figure 5:
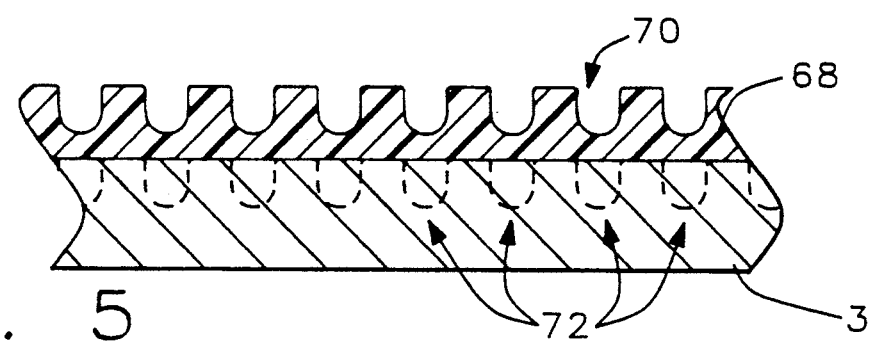

Referring now to FIGS. 3, 4 and 5, the critical features of the first embodiment of the invention will now be described. As described above in relation to FIGS. 2A and 2B the best resolution of a pattern of openings of 0.5 micrometers is the 0.5 micrometer hole pattern in the resulting resist mask. However, for the purpose of the present invention we do use, for example a 0.5 micrometer pattern mask, but we intentionally under-expose the resist through this mask by de-focusing the image, under-expose or a combination of under-expose and de-focusing the image the resist layer.

The resist layer 33 can be made of any conventional resist dependent, of course upon the particular radiant energy to be use to expose the resist. The normal thickness of resist layers today is between about 1.2 to 2.0 micrometers for the usual lithography applications. The resist layer 33 of the present invention is preferably between about 2000 to 5000 Angstroms, because it is for replication only.

The concepts of exposure for under-exposure and de-focusing the image is critical to out invention. These concepts in all other cases than the present one, are avoided by those skilled in the art. The book "VLSI Technology" International Edition by S. M. Sze Second Edition 1988 Published by McGraw-Hill Book Co., New York, N.Y. discusses in Chapter 10.5 pages 442-456 the background and typical simulation results for projection optical and electron-beam lithography. The intent is to produce completely exposed images in the resist, but implicit in this is what is needed to under-expose and de-focus the image which is needed by the present process.

For example, with the 2.5 micrometers openings mask, with 5×reduction projector stepper the exposed region is chosen to be 0.1 micrometers as seen in at 62 in FIG. 3. The spacing between the exposed regions is 0.9 micrometers instead of the fully exposed 0.5 micrometers in FIGS. 2A and 2B. The resist is not developed at this point. The mask is now shifted a fixed and short distance which in this case may be 0.5 micrometers in the stepper and resulting in 0.1 micrometer movement in the resist. The same under-exposure and/or de-focusing the image step as before is repeated to give the exposed region 63 as seen in FIG. 4. The mask is repeatedly shifted and the under-exposure and/or de-focusing the image is accomplished to produce the exposed resist structure as shown in FIG. 4 having exposed regions 62, 63, 64, 65, and 66 of a uniform width of about of about 0.1 and a uniform spacing of about 0.1 micrometers. The resist is now developed as is well understood in the art to produce the regular microscopic ripple 70 in the developed resist layer 68. By this technique, there is created a 0.1 micrometer developed ripple hole and 0.1 micrometer spacing on the resist in the 0.5 micrometer generation technology lithography capability.

The FIG. 5 structure is placed in an anisotropic etching chamber having a suitable ambient to directionality and uniformly etch both the resist layer 68 and the polycrystalline silicon layer 32. The result of the etching is the formation of the regular microscopic ripple 72 (as shown in dashed lines in FIG. 5) in the polycrystalline silicon layer 32. The ripple depth is preferably between about 0.05 and 0.2 micrometers. The ambient of the etching is, as one example $CF_4:Cl_2:O_2$ with ratio 25:25:2 and the conditions of etching are pressure of 280 mTorr, and power of 400 watts at 13.56 MHz frequency. At these conditions the etching rate of resist to polysilicon is about 1.2:1 to 0.8:1.0.

It is also known, if a phase-shifting technique is used, the resolution can be improved. For example in the I-line stepper, 0.5 micrometers can resolve in the conventional approach as described above. With the use of the phase-shifting technique, 0.3 micrometers can be resolved. However, 0.1 micrometers or less is impossible at this time by phase-shifting techniques. The article, "Phase-Shifting Technology-Applications and a Perspective" by T. Terasawa et al in 1991 4th MicroProcess Conference July 15-18 Kanazawa, Japan Sponsored by the Japan Society of Applied Physics A-6-1 pages 58-61 describes the principals of phase-shifting technology. The use of phase-shifting with the first embodiment of the invention, allows the reduction of the number of shifts of the mask to produce the 0.1 micrometer ripple.

The residual resist is removed by oxygen ashing as is known in the art. Following the removal of the residual resist, the ripple patterned first polysilicon layer is patterned, using conventional lithography and etching techniques.

The process then continues with reference to FIG. 1. A thin dielectric layer 38 is deposited. This layer serves as the capacitor dielectric. The thin dielectric or insulating layer has a thickness that is preferably in the range of about 30 to 250 Angstroms. The material of the dielectric layer can be of any suitable material having a high dielectric constant, and which forms a continuous, pinhole free layer. Preferably the dielectric layer is a composite layer of a silicon oxide-silicon nitride-silicon oxide (ONO) with a total thickness of between about 40 to 150 Angstroms. Alternatively, and of particular importance for the future is the dielectric tantalum oxide, such as tantalum pentoxide or in combination with silicon dioxide and/or silicon nitride.

The preferred thickness of tantalum oxide or tantalum pentoxide is between about 150 Angstroms to 1000 Angstroms. The materials are of particular importance, because of their high dielectric constant and the well understood relationship between capacitance, C, dielectric constant, E, and thickness of dielectric, d, which is $C=E/d$. The dielectric constant of silicon dioxide is 3.9, silicon nitride is 8.0 and tantalum pentoxide is 22.0. Therefore, the effective thickness of tantalum pentoxide is about 5 times thinner than silicon dioxide.

Tantalum oxide may be deposited by several well known methods including chemical vapor deposition as taught by, for example M. Saitoh et al ELECTRICAL PROPERTIES OF THIN TA$_2$O$_5$ FILMS GROWN BY CHEMICAL VAPOR DEPOSITION published at IEDM 86 pages 680–683; Y Numasawa et al TA$_2$O$_5$ PLASMA TECHNOLOGY FOR DRAM STACKED CAPACITORS published at IEDM 89 pages 43–46; and by reactive sputtering deposition as shown by H. Shinriki et al OXIDIZED TA$_2$O$_5$/SI$_3$N$_4$ DIELECTRIC FILMS FOR ULTIMATE STC DRAMS published in IEDM 86 pages 684–687.

As shown in FIG. 1, a second polycrystalline silicon layer 40 is deposited over layer 38 and patterned to serve as the second or plate electrode. The first polycrystalline silicon layer 32 is the storage node of the capacitor. The second polycrystalline silicon layer is also doped with an impurity, preferably with a concentration in the range of about $10^{19}$ to $10^{21}$ atoms per cm.$^3$.

Figure 6:
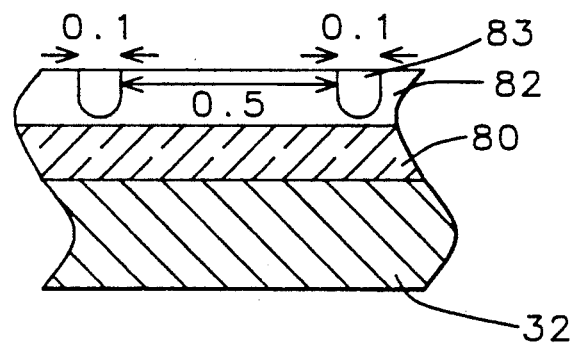
FIGS. 6, 7, and 8 schematically show a second embodiment method for making the regular microscopic ripple capacitor of the present invention.
Figure 7:
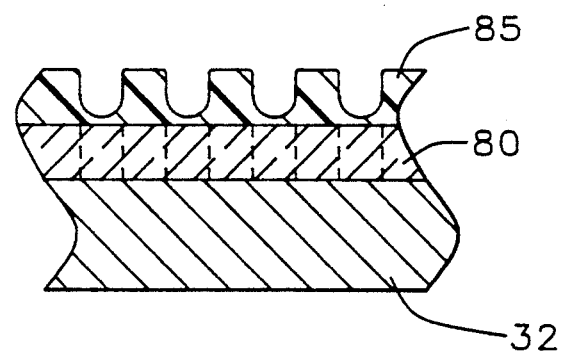
Figure 8:
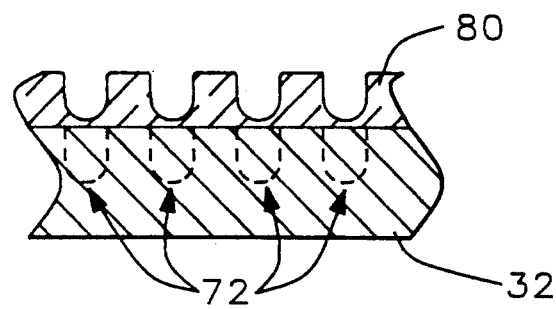

Referring now to FIGS. 6, 7 and 8, a modification of the above method and second embodiment uses a thin layer, such as silicon oxide 80 between the resist layer 82 and the polysilicon layer 32. The thin layer 80 can be between about 200 to 1000 Angstroms. The resist layer may be thinner than in the first embodiment and the exposures can almost be through the resist layer. The thickness of the resist is between about 500 to 1000 Angstroms. The exposure techniques of under-exposure, de-focusing or a combination of under-exposure and de-focusing is done as in the first embodiment to produce the FIG. 6 structure with exposed regions 83. We show a 0.5 micrometers spacing, since in this example we are using the phase-shifting mask technique. The mask needs only to be shifted twice and exposed using a phase-shifting mask technique to expose other regions (not shown in FIG. 6, but the development result is shown in FIG. 7). Development of the resist produces the ripple in the developed resist layer 85 as in the first embodiment as shown in FIG. 7. The resist layer and the thin layer, such as silicon oxide are uniformly and anisotropically etched to create the pattern of regular microscopic ripple in the surface of the silicon oxide layer. This is shown in dashed lines in FIG. 7 and after etching of the remaining resist layer 85 in FIG. 8. Now the thin layer, such as silicon oxide 80 with the ripple pattern is used as a mask to uniformly and anistropically etch the first polycrystalline layer to create the pattern of ripple in the surface of the polycrystalline silicon layer. There are many etches with high selectivity between silicon oxide and polysilicon. One effective etchant is HCl+Cl$_2$+O$_2$(60:8:X ratio) with pressure of 100 mTorr, power of 175 watts at 13.56 MHz. The selectivity ratio is polysilicon:silicon oxide of 200:1. The resulting polysilicon microscopic ripple in layer 32 which is seen in FIG. 1 (although a greatly enlarged ripple patterned is pictured) is very easy to replicate and forms even deeper and sharper ripple trenches in the layer 32 than does the first embodiment. Then the silicon oxide 80 mask layer is removed by dipping into HF solution. The ripple depth is preferably between about 0.05 and 0.2 micrometers. The formation of the capacitor continues as was described with regard to the first embodiment.

The completion of the metal contacts to the monocrystalline silicon regions such as the bit line 44 contact to source regions 24 is now conventionally accomplished. Insulating structure 42 may be composed of, for example a layer of silicon dioxide and a much thicker layer of borophosphosilicate glass, phosphosilicate glass or similar insulating layer. The operational thicknesses of these layers are between about 1000 to 2000 Angstroms for the oxide layer and between about 2000 to 10,000 or more Angstroms for the glasseous layer. These layers are typically deposited by chemical vapor deposition in low pressure or atmospheric pressure, or in a plasma enhanced reactive chamber.

The contact windows or openings are now formed through the insulating layered structure to the source regions 24 or the like in the device regions. The openings are not shown to the other regions, because they are outside of the cross-section of FIG. 1. This process step is conventionally done by lithography and etching techniques which preferably use a reactive ion etching process that will anisotropically etch both components of the insulating layer structure 42. A typical reactive ion etching process using fluorine contianing etching chemical species. These oxide/glass layers etching processes are well known to those in the art. The size of the contact window opening can be as small as limitation of the etching and lithography patterning capability.

A bit line metal or composite metal layer or polycide composite layer (such as tungsten polycide) 44 is deposited over the exposed device region 24 and the insulating layer structure 42 both above and on the sides of the opening. This layer may be deposited by, for example chemical vapor deposition or sputtering. The operational thickness is between about 2000 to 10,000 Angstroms and the preferred thickness is between about 5000 to 7000 Angstroms. The thickness of this layer 44 is dependant upon the height and profile of the contact hole. This metal layer may be aluminum, aluminum-silicon, aluminum-silicon-copper, polycide, conductively doped polysilicon, tungsten or the like. Alternatively, a barrier metal layer (not shown) can be used under this metal layer.

The next level of metallurgy is formed by deposition of a suitable insulating layer 45 over the polysilicon bit line 44. This layer may be a composite layer of, for example silicon oxide, cured spin-on-glass and silicon oxide as is known in the art. The metallurgy 50, which is typically aluminium, aluminum/silicon, tungsten or aluminum/silicon/copper, is then deposited by conventional evaporation, sputtering, chemical vapor deposition or the like and patterned using lithography and etching techniques to produce the final structure shown in FIG. 1.

The effective capacitor area, due to the regular ripple surface of the electrode, increases the electrical capacitance, per unit planar area, of the capacitor by approximately 50% to 100% or more. This will make it possible to fabricate DRAMs of 16 Mbit, 64 Mbit 256 Mbit or beyond with a simple stacked capacitor as described by the invention herein wherein ONO dielectric is used. To otherwise produce a capacitor for 16 to 256 Mbit DRAMs would require a 3-D complicated capacitor structure using ONO. When using the present invention, 1 Gbit or more DRAMs are possible using tantalum oxide dielectric materials.

While the invention has been particularly shown and described with reference to the preferred embodiments thereof, it will be understood by those skilled in the art that various changes in form and details may be made without departing from the spirit and scope of the invention.

What is claimed is:

1. A method for producing a regular microscopic ripple surface capacitor fabricated on a monocrystalline semiconductor substrate comprising:

depositing a first polycrystalline silicon layer to form a first capacitor plate on a partially completed device structure over a base insulating layer and a contact opening exposing said substrate;

forming a resist layer over said first polycrystalline silicon layer;

exposing said resist layer through a mask having a pattern of regular spaced openings in the areas of the planned said capacitor to radiant energy in sufficient quantity through a lens system to under-expose, de-focus an image on said resist layer or a combination of under-expose and de-focus an image on said resist layer to create in said resist layer a ripple image wherein said image does not reach said first polycrystalline silicon layer;

shifting said mask a fixed distance;

exposing said resist layer through the said shifted mask to radiant energy in sufficient quantity through a lens system to under-expose, de-focus an image on said resist layer or a combination of under-expose and de-focus an image on said resist layer to create in said resist layer a ripple image wherein said image does not reach said first polycrystalline silicon layer;

repeating said shifting said mask and exposing said resist steps until a pattern of said regular microscopic ripple has been formed in said resist layer;

developing said resist layer to leave said pattern of regular microscopic ripple in the surface of the resist layer;

uniformly and anisotropically etching the said resist layer and said first polycrystalline silicon layer to create said pattern of regular microscopic ripple in the surface of said first polycrystalline layer;

removing the remaining said resist layer;

depositing an insulating layer to form a capacitor dielectric layer over the surface of the said first polycrystalline layer; and depositing a second polycrystalline silicon layer over said insulating layer to form the second capacitor plate and complete said regular microscopic surface capacitor.

2. The method of claim 1 wherein said pattern of regular openings is uniform in both the X and Y directions and the opening size is less than about 2.5 micrometers and the spacing between said openings is uniformly less than about 2.5 micrometers and a 5× reduction projection stepper is used.

3. The method of claim 1 wherein phase-shifting technique is used to improve the resolution of the mask and said shifting said mask is less than about 3 repetitions to produce the desired said regular microscopic ripple.

4. The method of claim 2 wherein said shifting said mask distance is between about 0.5 to 0.1 micrometers and said shifting said mask is less than about 10 repetitions to produce desired said regular microscopic ripple.

5. The method of claim 1 wherein the thickness of said resist layer is between about 2000 to 5000 Angstroms and said etching of said resist layer and first polycrystalline silicon layer is accomplished by exposure to an ambient of $CF_4+Cl_2+O_2$ in a ratio of 25:25:2.

6. The method of claim 1 wherein said pattern of regular microscopic ripple has a ripple width of less than about 0.1 micrometers and a spacing between ripples of less than about 0.1 micrometers in said first polycrystalline silicon layer.

7. The method of claim 6 wherein said ripple depth is between about 0.05 to 0.2 micrometers.

8. The method of claim 1 wherein said contact opening exposing said substrate allows the electrical contact of said first polycrystalline silicon layer to a source/drain region in said substrate and the partially completed structure is a dynamic random access memory.

9. The method of claim 1 wherein the thickness of said capacitor dielectric layer is between about 30 to 250 Angstroms.

10. The method of claim 9 wherein said capacitor dielectric layer is a composite layer of silicon oxide, silicon nitride and silicon oxide.

11. The method of claim 9 wherein said capacitor dielectric layer at least includes tantalum oxide.

12. The method of claim 9 wherein the thickness of said second polycrystalline silicon layer is between about 500 to 5000 Angstroms.

13. The method of claim 1 wherein said ripple surface capacitor is made in combination with a field effect transistor and is adapted for use in a high density dynamic random access memory.

14. The method of claim 1 wherein following said removal of said resist layer, the said first polycrystalline silicon layer is patterned as an electrode of said capacitor.

15. A method for producing a regular microscopic ripple surface capacitor fabricated on a monocrystalline semiconductor substrate comprising:

depositing a first polycrystalline silicon layer to form a first capacitor plate on a partially completed device structure over a base insulating layer and a contact opening exposing said substrate;

forming a layer that can be a selective etching mask for polycrystalline silicon over said first polycrystalline silicon layer;

forming a resist layer over said layer over said fist layer;

exposing said resist layer through a mask having a pattern of regular spaced openings in the areas of the planned said capacitor to radiant energy in sufficient quantity through a lens system to under-expose, de-focus an image on said resist layer or a combination of under-expose and de-focus an image on said resist layer to create in said resist layer a ripple image wherein said image does not reach said first polycrystalline silicon layer;

shifting said mask a fixed distance;

exposing said resist layer through the said shifted mask to radiant energy in sufficient quantity through a lens system to under-expose, de-focus an image on said resist layer or a combination of under-expose and de-focus an image on said resist layer to create in said resist layer a ripple image wherein said image does not reach said first polycrystalline silicon layer;

repeating said shifting said mask and exposing said resist steps until a pattern of said regular microscopic ripple has been formed in said resist layer;

developing said resist layer to leave said pattern of regular microscopic ripple in the surface of the resist layer;

uniformly and anisotropically etching the said resist layer and said layer over said first layer to create said pattern of regular microscopic ripple mask;

removing the remaining said resist layer;

uniformly and anisotropically etching the said regular microscopic ripple into the surface of said first polycrystalline layer;

removing the remaining said layer over said first layer;

depositing an insulating layer to form a capacitor dielectric layer over the surface of the said first polycrystalline layer; and depositing a second polycrystalline silicon layer over said insulating layer to form the second capacitor plate and complete said regular microscopic surface capacitor.

16. The method of claim 15 wherein the said layer over said first layer is silicon oxide, the thickness of said resist layer is between about 500 to 1000 Angstroms and the thickness of said silicon oxide layer is between about 200 to 1000 Angstroms.

17. The method of claim 15 wherein said pattern of regular openings is uniform in both the X and Y directions and the opening size is less than about 2.5 micrometers and the spacing between said openings is uniformly less than about 2.5 micrometers and a 5× reduction projection stepper is used in the exposing steps.

18. The method of claim 17 wherein phase-shifting technique is used to improve the resolution of the mask and said shifting said mask is less than about 3 repetitions to produce the desired said regular microscopic ripple.

19. The method of claim 17 wherein said shifting said mask distance is between about 0.5 to 0.1 micrometers and said shifting said mask is less than about 10 repetitions to produce the desired said regular microscopic ripple.

20. The method of claim 15 wherein said pattern of regular microscopic ripple has a ripple width of less than about 0.1 micrometers and a spacing between ripples of less than about 0.1 micrometers in said first polycrystalline silicon layer.

21. The method of claim 20 wherein said ripple depth is between about 0.05 to 0.2 micrometers.

22. The method of claim 15 wherein said contact opening exposing said substrate allows the electrical contact of said first polycrystalline silicon layer to a source/drain region in said substrate and the partially completed structure is a dynamic random access memory.

23. The method of claim 15 wherein the thickness of said capacitor dielectric layer is between about 30 to 250 Angstroms.

24. The method of claim 23 wherein said capacitor dielectric layer is a composite layer of silicon oxide, silicon nitride and silicon oxide.

25. The method of claim 23 wherein said capacitor dielectric layer at least includes tantalum oxide.

* * * * *